(12) United States Patent
Miyagi et al.

(10) Patent No.: US 11,958,952 B2
(45) Date of Patent: Apr. 16, 2024

(54) SURFACE-TREATED GLASS CLOTH, PREPREG, AND PRINTED WIRING BOARD

(71) Applicant: NITTO BOSEKI CO., LTD., Fukushima (JP)

(72) Inventors: Hiromitsu Miyagi, Fukushima (JP); Kazutaka Adachi, Fukushima (JP); Atsushi Ouchi, Fukushima (JP); Shohei Iwasawa, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 520 days.

(21) Appl. No.: 17/424,673

(22) PCT Filed: Jul. 2, 2019

(86) PCT No.: PCT/JP2019/026372
§ 371 (c)(1),
(2) Date: Jul. 21, 2021

(87) PCT Pub. No.: WO2020/194772
PCT Pub. Date: Oct. 1, 2020

(65) Prior Publication Data
US 2022/0106453 A1 Apr. 7, 2022

(30) Foreign Application Priority Data
Mar. 27, 2019 (JP) .................. 2019-061152

(51) Int. Cl.
| | |
|---|---|
| C08J 5/24 | (2006.01) |
| B29B 11/16 | (2006.01) |
| C03C 3/091 | (2006.01) |
| C03C 13/00 | (2006.01) |
| C03C 25/1095 | (2018.01) |
| D03D 15/00 | (2021.01) |
| D03D 15/267 | (2021.01) |
| H05K 1/03 | (2006.01) |

(52) U.S. Cl.
CPC .............. *C08J 5/248* (2021.05); *B29B 11/16* (2013.01); *C03C 3/091* (2013.01); *C03C 13/00* (2013.01); *C03C 25/1095* (2013.01); *D03D 15/00* (2013.01); *D03D 15/267* (2021.01); *H05K 1/0306* (2013.01); *H05K 1/038* (2013.01); *C03C 2213/00* (2013.01); *C08J 2371/12* (2013.01)

(58) Field of Classification Search
CPC .. C08J 5/24; C03C 13/00; C03C 3/091; C03C 2/1095; H05K 1/03; B29B 11/16; D03D 15/267
USPC ........................................................ 523/222
See application file for complete search history.

(56) References Cited

U.S. PATENT DOCUMENTS

| | | | | |
|---|---|---|---|---|
| 11,149,363 | B2 * | 10/2021 | Ikejiri | ............... D03D 1/0082 |
| 2003/0054936 | A1 | 3/2003 | Tamura | |
| 2018/0127305 | A1 * | 5/2018 | Li | ......................... C03C 3/093 |
| 2019/0153635 | A1 * | 5/2019 | Ikejiri | ............... D03D 15/267 |

FOREIGN PATENT DOCUMENTS

| | | | | |
|---|---|---|---|---|
| JP | H03-275719 | A | 12/1991 | |
| JP | H11-292567 | A | 10/1999 | |
| JP | 4269194 | B2 | 5/2009 | |
| JP | 2011-001473 | A | 1/2011 | |
| JP | 2012-076410 | A | 4/2012 | |
| JP | 2018-127749 | A | 8/2018 | |
| JP | 6468409 | B1 | 2/2019 | |
| WO | 2011/125396 | A1 | 10/2011 | |
| WO | WO-2016183133 | A1 * | 11/2016 | ............ C03C 13/00 |
| WO | WO-2017168921 | A1 * | 10/2017 | ........... D03D 1/0082 |

* cited by examiner

*Primary Examiner* — Deve V Hall
(74) *Attorney, Agent, or Firm* — Carrier, Shende & Associates P.C.; Joseph P. Carrier; Fulchand P. Shende

(57) ABSTRACT

Provided are a surface-treated glass cloth capable of enhancing insulation reliability when used to prepare a prepreg, a prepreg and a printed wiring board using the surface-treated glass cloth. The surface-treated glass cloth includes a surface treatment layer on a surface, a glass constituting the glass cloth has a composition containing 52.0 to 60.0 mass % of $SiO_2$, 15.0 to 26.0 mass % of $B_2O_3$, 9.0 to 18.0 mass % of $Al_2O_3$, 1.0 to 8.0 mass % of MgO, 1.0 to 10.0 mass % of CaO, 0 to 6.0 mass % of SrO, 0 to 6.0 mass % of $TiO_2$, and 0.1 to 3.0 mass % in total of $F_2$ and $Cl_2$, based on the total amount of the glass, the glass cloth has a surface coverage of 75.0 to 100.0% and a thickness of 8 to 95 μm, and the surface treatment layer contains a silane coupling agent having a methacrylic group and contains no surfactant.

9 Claims, 1 Drawing Sheet

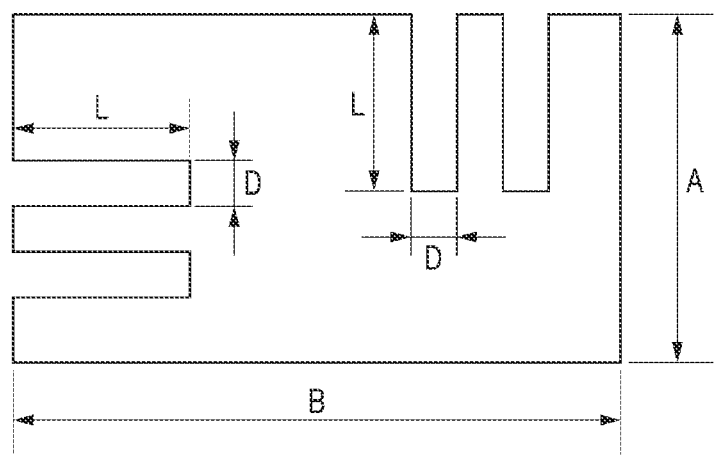

SURFACE-TREATED GLASS CLOTH, PREPREG, AND PRINTED WIRING BOARD

TECHNICAL FIELD

The present invention relates to a surface-treated glass cloth, a prepreg using the surface-treated glass cloth, and a printed wiring board using the surface-treated glass cloth.

BACKGROUND ART

A surface-treated glass cloth used for a prepreg that constitutes a printed wiring board has been conventionally known. As a glass fiber constituting the surface-treated glass cloth, one having a composition containing 15 mass % or more of $B_2O_3$ is known (see, for example, Patent Literatures 1 and 2).

CITATION LIST

Patent Literature

Patent Literature 1: Japanese Patent No. 4269194
Patent Literature 2: Japanese Patent No. 6468409

SUMMARY OF INVENTION

Technical Problem

However, the present inventors have found that when a prepreg is prepared using a surface-treated glass cloth obtained by surface-treating a glass cloth having been obtained by weaving glass fibers having a composition containing 15 mass % or more of $B_2O_3$, with a silane coupling agent having a methacrylic group, there are disadvantages that interfacial peeling occurs at the interface between a glass and a resin, and the insulation reliability is decreased.

It is an object of the present invention to eliminate such disadvantages and to provide a surface-treated glass cloth capable of enhancing insulation reliability when used to prepare a prepreg, a prepreg using the surface-treated glass cloth, and a printed wiring board using the surface-treated glass cloth.

Solution to Problem

In order to achieve the above object, the present inventors have earnestly studied, and as a result, the present inventors have found that by incorporating no surfactant when surface treatment with a silane coupling agent having a methacrylic group is carried out, peeling at the interface between a glass and a resin can be suppressed.

A surfactant is usually used for homogeneously dispersing a silane coupling agent in a surface treatment agent, and owing to this, a homogeneous surface treatment layer can be formed on a surface of a glass cloth. Since a homogeneous surface treatment layer is formed, peeling at the interface between a glass and a resin is suppressed. On that account, it is common to add a surfactant to the surface treatment agent for a glass cloth. However, the present inventors have surprisingly found a previously unexpected fact that the interfacial peeling between a glass and a resin can be inhibited by incorporating no surfactant only when a silane coupling agent having a methacrylic group is used for a surface treatment layer of a glass cloth which is constituted of glass fibers having a composition containing 15 mass % or more of $B_2O_3$ and which satisfies certain requirements.

The surface-treated glass cloth of the present invention is a surface-treated glass cloth comprising a surface treatment layer on a surface, wherein a glass constituting the glass cloth has a composition containing 52.0 to 60.0 mass % of $SiO_2$, 15.0 to 26.0 mass % of $B_2O_3$, 9.0 to 18.0 mass % of $Al_2O_3$, 1.0 to 8.0 mass % of MgO, 1.0 to 10.0 mass % of CaO, 0 to 6.0 mass % of SrO, 0 to 6.0 mass % of $TiO_2$, and 0.1 to 3.0 mass % in total of $F_2$ and $Cl_2$, based on the total amount of the glass, the glass cloth has a surface coverage of 75.0 to 100.0% and a thickness of 8 to 95 μm, and the surface treatment layer contains a silane coupling agent having a methacrylic group and contains no surfactant.

In the surface-treated glass cloth of the present invention, the glass constituting the glass cloth has a composition containing 15 mass % or more of $B_2O_3$, specifically a composition containing 52.0 to 60.0 mass % of $SiO_2$, 15.0 to 26.0 mass % of $B_2O_3$, 9.0 to 18.0 mass % of $Al_2O_3$, 1.0 to 8.0 mass % of MgO, 1.0 to 10.0 mass % of CaO, 0 to 6.0 mass % of SrO, 0 to 6.0 mass % of $TiO_2$, and 0.1 to 3.0 mass % in total of $F_2$ and $Cl_2$, based on the total amount of the glass, and the surface treatment layer contains a silane coupling agent having a methacrylic group and contains no surfactant, and therefore, when the glass cloth is used to prepare a prepreg, interfacial peeling occurring at the interface between a glass and a resin can be suppressed, and the insulation reliability can be enhanced.

When the surface treatment layer contains a silane coupling agent other than the silane coupling agent having a methacrylic group, the surface-treated glass cloth cannot obtain an effect of inhibiting interfacial peeling due to non-containing of a surfactant.

In the surface-treated glass cloth of the present invention, a silica microparticle preferably adheres to a surface of a glass filament constituting the glass cloth. In the surface-treated glass cloth of the present invention, a silica microparticle adheres to a surface of a glass filament constituting the glass cloth, and therefore, even when the surface treatment layer contains a surfactant, interfacial peeling occurring at the interface between the glass and a resin can be suppressed, and since the surface treatment layer contains no surfactant, the insulation reliability can be further enhanced.

In the surface-treated glass cloth of the present invention, the glass cloth preferably has a surface coverage of 85.5 to 100.0%. In the surface-treated glass cloth of the present invention, the glass cloth has a surface coverage of 85.5 to 100.0%, and therefore, even when the surface treatment layer contains a surfactant, interfacial peeling occurring at the interface between the glass and a resin can be suppressed, and since the surface treatment layer contains no surfactant, the insulation reliability can be further enhanced.

The surface coverage can be calculated from the following formula.

$$\text{Surface coverage} = 100 \times (25000(\mu m) \times \text{width of warp yarn } (\mu m) \times \text{weaving density of warp yarns (yarns/25 mm)} + 25000(\mu m) \times \text{width of weft yarn } (\mu m) \times \text{weaving density of weft yarns (yarns/25 mm)} - \text{width of warp yarn } (\mu m) \times \text{weaving density of warp yarns (yarns/25 mm)} \times \text{width of weft yarn } (\mu m) \times \text{weaving density of weft yarns (yarns/25 mm)}) / (25000(\mu m) \times 25000(\mu m))$$

Here, regarding widths of a warp yarn and a weft yarn, three samples of 60 mm×100 mm are cut out from a surface-treated glass cloth, and widths of 30 warp yarns or 30 weft yarns per sample are measured by using a microscope (manufactured by Keyence Corporation, trade name:

VHX-2000, magnifying power: 200-fold magnification), and an average value of the measured values can be adopted as widths of a warp yarn and a weft yarn. The weaving densities of the warp yarns and the weft yarns can be determined by counting the number of warp (weft) yarns present in the range of 25 mm in the warp (weft) direction using a textile Lunometer in accordance with JIS R 3420.

When the surface-treated glass cloth of the present invention has a surface coverage of 85.5 to 100.0%, the glass cloth preferably has a thickness of 8 to 60 µm, and more preferably has a thickness of 8 to 40 µm. When the surface-treated glass cloth of the present invention has a surface coverage of 85.5 to 100.0%, the glass cloth preferably has a thickness of 8 to 60 µm, and more preferably a thickness of 8 to 40 µm, and therefore, the effect of enhancing insulation reliability due to the surface treatment layer containing no surfactant can be further increased.

In the surface-treated glass cloth of the present invention, the composition of the glass constituting the glass cloth is preferably, for example, a first aspect containing 52.0 to 60.0 mass % of $SiO_2$, 15.0 mass % or more and less than 20.0 mass % of $B_2O_3$, 9.0 to 18.0 mass % of $Al_2O_3$, 1.0 to 6.0 mass % of MgO, 1.0 to 9.0 mass % of CaO, 0 mass % or more and less than 0.5 mass % of SrO, 1.0 to 6.0 mass % of $TiO_2$, and 0.1 to 2.5 mass % in total of $F_2$ and $Cl_2$, based on the total amount of the glass, or a second aspect containing 52.0 to 60.0 mass % of $SiO_2$, 20.0 mass % or more and less than 26.0 mass % of $B_2O_3$, 9.0 to 18.0 mass % of $Al_2O_3$, 1.0 to 6.0 mass % of MgO, 1.0 to 9.0 mass % of CaO, 0.5 mass % or more and less than 6.0 mass % of SrO, 0 to 6.0 mass % of $TiO_2$, and 0.1 to 2.5 mass % in total of $F_2$ and $Cl_2$, based on the total amount of the glass.

When the composition of the glass constituting the surface-treated glass cloth of the present invention is the first aspect, the glass cloth can obtain a tensile strength higher than that when the composition is the second aspect. When the composition of the glass constituting the surface-treated glass cloth of the present invention is the second aspect, the glass cloth can make the effect of enhancing insulation reliability due to the surface treatment layer containing no surfactant greater than that when the composition of the glass constituting the glass cloth is the first aspect.

The prepeg of the present invention comprises the surface-treated glass cloth of the present invention, and the printed wiring board of the present invention comprises the surface-treated glass cloth of the present invention.

BRIEF DESCRIPTION OF DRAWING

FIG. 1 is a plan view showing a shape of a specimen used in an alkaline whitening test.

DESCRIPTION OF EMBODIMENTS

Next, embodiments of the present invention will be described in more detail with reference to the attached drawing.

The surface-treated glass cloth of the present embodiment comprises a surface treatment layer on a surface, and a glass constituting the glass cloth has a composition containing 52.0 to 60.0 mass % of $SiO_2$, 15.0 to 26.0 mass % of $B_2O_3$, 9.0 to 18.0 mass % of $Al_2O_3$, 1.0 to 8.0 mass % of MgO, 1.0 to 10.0 mass % of CaO, 0 to 6.0 mass % of SrO, 0 to 6.0 mass % of $TiO_2$, and 0.1 to 3.0 mass % in total of $F_2$ and $Cl_2$, based on the total amount of the glass.

In the surface-treated glass cloth of the present embodiment, the composition of the glass constituting the glass cloth can be, for example, a first aspect containing 52.0 to 60.0 mass % of $SiO_2$, 15.0 mass % or more and less than 20.0 mass % of $B_2O_3$, 9.0 to 18.0 mass % of $Al_2O_3$, 1.0 to 6.0 mass % of MgO, 1.0 to 9.0 mass % of CaO, 0 mass % or more and less than 0.5 mass % of SrO, 1.0 to 6.0 mass % of $TiO_2$, and 0.1 to 2.5 mass % in total of $F_2$ and $Cl_2$, based on the total amount of the glass, or a second aspect containing 52.0 to 60.0 mass % of $SiO_2$, 20.0 mass % or more and less than 26.0 mass % of $B_2O_3$, 9.0 to 18.0 mass % of $Al_2O_3$, 1.0 to 6.0 mass % of MgO, 1.0 to 9.0 mass % of CaO, 0.5 mass % or more and less than 6.0 mass % of SrO, 0 to 6.0 mass % of $TiO_2$, and 0.1 to 2.5 mass % in total of $F_2$ and $Cl_2$, based on the total amount of the glass.

In the first aspect, the content of $SiO_2$ is preferably in the range of 52.5 to 59.0 mass %, more preferably in the range of 53.0 to 58.0 mass %, and still more preferably in the range of 53.5 to 57.0 mass %. The content of $B_2O_3$ is preferably in the range of 16.0 to 19.8 mass %, more preferably in the range of 17.0 to 19.7 mass %, and still more preferably in the range of 18.0 to 19.6 mass %. The content of $Al_2O_3$ is preferably in the range of 10.0 to 17.5 mass %, more preferably in the range of 11.0 to 17.0 mass %, and still more preferably in the range of 12.0 to 16.5 mass %. The content of MgO is preferably in the range of 1.5 to 6.0 mass %, more preferably in the range of 2.0 to 5.5 mass %, and still more preferably in the range of 3.0 to 5.0 mass %. The content of CaO is preferably in the range of 1.5 to 8.0 mass %, more preferably in the range of 2.0 to 7.0 mass %, and still more preferably in the range of 3.0 to 5.0 mass %. The content of SrO is preferably in the range of 0 to 0.1 mass %, more preferably in the range of 0 to 0.05 mass %, and still more preferably in the range of 0 to 0.01 mass %. The content of $TiO_2$ is preferably in the range of 1.0 to 5.5 mass %, and still more preferably in the range of 1.5 to 4.5 mass %. The total content of $F_2$ and $Cl_2$ is preferably in the range of 0.1 to 2.0 mass %, more preferably in the range of 0.1 to 1.5 mass %, and still more preferably in the range of 0.2 to 1.2 mass %.

In the second aspect, the content of $SiO_2$ is preferably in the range of 52.5 to 59.0 mass %, more preferably in the range of 53.0 to 58.0 mass %, and still more preferably in the range of 53.5 to 57.0 mass %. The content of $B_2O_3$ is preferably in the range of 21.0 to 24.8 mass %, more preferably in the range of 22.0 to 24.6 mass %, and still more preferably in the range of 23.0 to 24.4 mass %. The content of $Al_2O_3$ is preferably in the range of 9.5 to 17.0 mass %, more preferably in the range of 10.0 to 16.0 mass %, and still more preferably in the range of 10.5 to 14.5 mass %. The content of MgO is preferably in the range of 1.0 to 5.0 mass %, more preferably in the range of 1.0 to 4.0 mass %, and still more preferably in the range of 1.5 to 3.0 mass %. The content of CaO is preferably in the range of 1.0 to 7.0 mass %, more preferably in the range of 1.0 to 5.0 mass %, and still more preferably in the range of 1.5 to 3.0 mass %. The content of SrO is preferably in the range of 1.0 to 6.0 mass %, more preferably in the range of 1.5 to 5.5 mass %, and still more preferably in the range of 2.0 to 5.0 mass %. The content of $TiO_2$ is preferably in the range of 0 to 4.5 mass %, more preferably in the range of 0 to 3.0 mass %, and still more preferably in the range of 0 to 1.0 mass %. The total content of $F_2$ and $Cl_2$ is preferably in the range of 0.1 to 2.0 mass %, more preferably in the range of 0.1 to 1.5 mass %, and still more preferably in the range of 0.2 to 1.2 mass %.

In the surface-treated glass cloth of the present embodiment, the composition of the glass constituting the glass cloth may contain, in addition to the above components, 0 to 15.0 mass % of $P_2O_5$ based on the total amount of the glass. Further, the composition of the glass may contain 0 to 1.0 mass %, preferably 0.05 to 0.5 mass %, of $Fe_2O_3$ based on the total amount of the glass. Furthermore, the composition of the glass may contain 0 to 1.0 mass % in total of $Li_2O$, $K_2O$ and $Na_2O$ based on the total amount of the glass.

Here, regarding measurement of the content of each component in the composition of the aforesaid glass, the content of Li that is a light element can be measured by using an ICP emission spectroscopic analyzer, and the contents of other elements can be measured by using a wavelength-dispersive X-ray fluorescence analyzer.

In the measuring method, a glass cloth (when an organic substance adheres to the glass cloth surface, or when a glass cloth is contained in an organic substance (resin) mainly as a reinforcing material, the glass cloth is used after the organic substance is removed by, for example, heating the glass cloth in a muffle furnace at 300 to 600° C. for about 2 to 24 hours) is cut into an appropriate size, and then the resulting glass cloth is placed in a platinum crucible and kept at a temperature of 1550° C. for 6 hours in an electric furnace to melt it while stirring, thereby obtaining a homogenous molten glass. Next, the resulting molten glass is poured onto a carbon plate to prepare a glass cullet, and then the glass cullet is crushed into a powder. Regarding Li that is a light element, the glass powder is thermally decomposed with an acid and then subjected to quantitative analysis using an ICP emission spectroscopic analyzer. Regarding other elements, the glass powder is molded into a disc shape by a press machine and then subjected to quantitative analysis using a wavelength-dispersive X-ray fluorescence analyzer. These quantitative analytical results are subjected to oxide conversion, and the content of each component and the total amount thereof are calculated, and from these numerical values, the content (mass %) of the aforesaid each component can be determined.

In the surface-treated glass cloth of the present embodiment, the glass cloth has a surface coverage of 75.0 to 100.0% and a thickness of 8 to 95 μm, and the surface treatment layer contains a silane coupling agent having a methacrylic group and contains no surfactant.

Examples of the silane coupling agents having a methacrylic group in the surface-treated glass cloth of the present embodiment include 3-methacryloxypropylmethyldimethoxysilane, 3-methacryloxypropyltrimethoxysilane, 3-methacryloxypropylmethylmethoxysilane, and 3-methacryloxypropyltriethoxysilane.

Here, the silane coupling agent having a methacrylic group can be identified by, for example, GC-MS (e.g., GCMS-QP2010 Ultra (trade name) manufactured by Shimadzu Corporation).

The surfactant is usually used as a dispersant for a silane coupling agent in the surface treatment of a glass cloth, and specific examples include a nonionic surfactant, an anionic surfactant, a cationic surfactant, and an amphoteric surfactant. As the surfactants, these are adopted singly or in combination.

Examples of the nonionic surfactants include glycerol fatty acid ester, sorbitan fatty acid ester, sucrose fatty acid ester, polyoxyethylene alkyl ether, polyoxyethylene alkyl phenyl ether, polyoxyethylene polyoxypopylene glycol, fatty acid polyethylene glycol, fatty acid polyoxyethylene sorbitan, and fatty acid alkanolamide.

Examples of the anionic surfactants include fatty acid monocarboxylate, polyoxyethylene alkyl ether carboxylate, N-acylsarcosine salt, N-acylglutamate, dialkyl sulfosuccinate, alkanesulfonate, alpha olefin sulfonate, linear alkylbenzene sulfonate, alkylbenzene sulfonate, naphthalene sulfonate-formaldehyde condensate, alkylnaphthalene sulfonate, N-methyl-N-acyl taurine salt, alkyl sulfate, polyoxyethylene alkyl ether sulfate, fat and oil-sulfuric ester salt, alkyl phosphate, polyoxyethylene alkyl ether phosphate, and polyoxyethylene alkyl phenyl ether phosphate.

Examples of the cationic surfactants include monoalkylamine salt, dialkylamine salt, trialkylamine salt, alkyltrimethylammonium chloride, and alkylbenzalkonium chloride.

Examples of the amphoteric surfactants include alkylbetaine, fatty acid amidopropyl betaine, 2-alkyl-N-carboxymethyl-N-hydoxyethyl imidazolinium betaine, alkyldiethylenetriaminoacetic acid, and alkylamine oxide.

Here, absence of a surfactant in the surface-treated glass cloth of the present embodiment can be confirmed by non-detection of a component derived from the aforesaid surfactants from the surface-treated glass cloth with, for example, GC-MS (e.g., GCMS-QP2010 Ultra (trade name) manufactured by Shimadzu Corporation).

In the surface-treated glass cloth of the present embodiment, the surface treatment layer is formed in the range of 0.05 to 3.0 parts by mass to 100 parts by mass of the surface-treated glass cloth. The content of the silane coupling agent having a methacrylic group based on the total amount of the surface treatment layer is, for example, in the range of 80 to 100 mass %, preferably in the range of 90 to 100 mass %, and more preferably in the range of 95 to 100 mass %.

Here, the proportion of the mass of the surface treatment layer to the mass of the surface-treated glass cloth can be determined by measuring the mass of a specimen before and after drying by heating in accordance with JIS R 3420. The proportion of the silane coupling agent having a methacrylic group to the mass of the surface treatment layer can be determined by quantitatively determining the silane coupling agent with, for example, GC-MS (e.g., GCMS-QP2010 Ultra (trade name) manufactured by Shimadzu Corporation) and comparing the resulting value with the mass of the surface treatment layer.

In the surface-treated glass cloth of the present embodiment, the surface treatment layer may contain, for example, a silane coupling agent other than the silane coupling agent having a methacrylic group (e.g., a silane coupling agent having an amino group, a silane coupling agent having a glycidoxy group, a silane coupling agent having a vinyl group, a silane coupling agent having an acrylic group, a silane coupling agent having an isocyanate group, a silane coupling agent having a mercapto group, a silane coupling agent having a styryl group, a silane coupling agent having an ureido group), a weak acid (e.g., acetic acid, citric acid, formic acid), and an antifoaming agent (silicon-based antifoaming agent, emulsion type antifoaming agent, surfactant type antifoaming agent, oil-based antifoaming agent) in a total amount of 20 mass % or less based on the total amount of the surface treatment layer, in addition to the silane coupling agent having a methacrylic group.

In the surface-treated glass cloth of the present embodiment, silica microparticles preferably adhere to glass filaments constituting the glass cloth.

Here, as the silica microparticles, silica microparticles having a volume-average particle diameter of 30 to 300 nm can be used. The amount of the adhering silica microparticles can be, for example, 0.001 to 1 part by mass based on 100 parts by mass of a glass cloth which has not been surface-treated.

Adhesion of the silica microparticles in the surface-treated glass cloth of the present embodiment can be confirmed by observation with SEM (Scanning Electron Microscope). The amount of the adhering silica microparticles can be determined by observing the silica microparticles with SEM (Scanning Electron Microscope) and counting the number of the silica microparticles.

In the surface-treated glass cloth of the present embodiment, the glass cloth preferably has a surface coverage of 85.5 to 100.0%, and in this case, the glass cloth preferably has a thickness of 8 to 60 μm, and more preferably 8 to 40 μm.

In the surface-treated glass cloth of the present embodiment, the surface coverage is more preferably in the range of 87.0 to 99.9%, still more preferably in the range of 89.0 to 99.8%, particularly preferably in the range of 90.0 to 99.7%, and most preferably 90.5 to 99.6%.

The thickness of the surface-treated glass cloth of the present embodiment is still more preferably in the range of 9 to 35 μm.

Here, as the thickness of the surface-treated glass cloth, an average value of measured values obtained when the thicknesses of the surface-treated glass cloth at 15 points are measured by a micrometer in accordance with JIS R 3420 can be adopted.

The surface-treated glass cloth of the present embodiment can be produced in, for example, the following manner.

First, a prescribed glass batch (glass raw material) is melted and fiberized to obtain glass filaments. The glass filaments have a composition of, for example, the aforesaid first aspect or second aspect.

The filament diameters of the glass filaments are not particularly limited, but for the use as a reinforcing material of a thin fiber-reinforced resin molded body, they are each preferably 10 μm or less, more preferably 8 μm or less, and particularly preferably in the range of 3 to 5 μm.

The glass filaments, for example, 25 to 500, preferably 40 to 300 glass filaments, are bundled by a method known per se to prepare a glass fiber yarn. A process including melting a glass batch, fiberizing it to obtain glass filaments and then bundling a plurality of glass filaments to obtain a glass fiber yarn is referred to as fiber forming.

The count of the glass fiber yarn is preferably 0.8 to 135 tex, and more preferably 1 to 25 tex. The count (tex) of the glass fiber yarn corresponds to the mass (unit: g) per 1000 m of a glass fiber.

Next, the glass fiber yarns are woven as warp yarns or weft yarns to obtain a glass cloth. Examples of the methods for weaving include, but are not limited to, plain weave, satin weave and twill weave, and the method is preferably plain weave. The weaving density of the glass fiber yarns in the weaving is not particularly limited, but is preferably, for example, 10 to 150 yarns/25 mm, and more preferably 40 to 100 yarns/25 mm.

In the weaving, a sizing agent is used for bundling of the glass filaments, warping of warp yarns, etc. Examples of the sizing agent include a sizing agent in which the film-forming agent component is a starch-based one or a PVA (polyvinyl alcohol)-based one. The sizing agent may contain an oil, a softener, or the like.

The amount of the sizing agent adhering to the glass cloth is preferably 0.1 to 3 parts by mass, and more preferably 0.5 to 1.5 pans by mass, based on 100 parts by mass of the glass fiber yarns. When the range of the amount of the adhering sizing agent or the amount of the adhering sizing agent when not particularly specified, indicates an average of the amounts of the sizing agents adhering to the warp yarns or the weft yarns.

From the viewpoint of the use of the glass cloth obtained by the above weaving as a base material of a printed wiring board, the mass per unit area of the glass cloth is preferably 110 g/m$^2$ or less, and more preferably 50 g/m$^2$ or less. On the other hand, from the viewpoint of weaving performance, the mass per unit area of the glass cloth is preferably 8 g/m$^2$ or more.

Next, the glass cloth is subjected to opening treatment. Examples of the opening treatment include opening by water flow pressure, opening by high frequency oscillation using a liquid as a medium, opening by pressure of a fluid having surface pressure, and opening by application of pressure using a roll. Among the above opening treatment, opening by water flow pressure or opening by high frequency oscillation using a liquid as a medium is preferably used because variation in yarn width of each of the warp yarn and the weft yarn after the opening treatment is reduced. For the opening treatment, a plurality of the treatment methods may be used in combination.

Next, the glass cloth having been subjected to the opening treatment is subjected to desizing treatment. The desizing treatment can be carried out by, for example, arranging the glass cloth in a heating furnace at an ambient temperature of 350 to 450° C. for 40 to 80 hours to thermally decompose the sizing agent for fiber forming and the sizing agent for weaving adhering to the glass cloth.

Next, the glass cloth having been subjected to the desizing treatment is immersed in a surface treatment agent aqueous solution, squeezed to remove extra moisture, and then dried by heating at a temperature of 80 to 180° C. for a time of 1 to 30 minutes, for example, at 110° C. for 5 minutes, thereby obtaining the surface-treated glass cloth of the present embodiment.

As the surface treatment agent aqueous solution, a solution containing 0.1 to 2.0 mass % of the silane coupling agent having a methacrylic group, in terms of a solid content, and containing 0.1 to 1.0 mass % of a weak acid (e.g., acetic acid, citric acid) as a pH adjustor, based on the total amount of the surface treatment agent aqueous solution; can be used. The weak acid may not remain in the surface treatment layer of the surface-treated glass cloth in some cases because it volatilizes during the heating-drying process.

The prepreg of the present embodiment comprises the aforesaid surface-treated glass cloth of the present embodiment.

The prepreg of the present embodiment is obtained by impregnating the aforesaid surface-treated glass cloth with a resin by a method known pe se and semi-curing the resin.

In the prepreg of the present embodiment, the resin used for impregnation of the aforesaid surface-treated glass cloth is not particularly limited. Examples of such resins include epoxy resin, phenolic resin, unsaturated polyester resin, melamine resin, modified polyimide resin, polyamide resin, polyimide resin, polybutylene terephthalate resin, polyethylene terephthalate resin, polyphenylene sulfide resin, polyphenylene ether resin, modified polyphenylene ether resin, and fluororesin. Among these, polyphenylene ether resin or modified polyphenylene ether resin can be preferably used because the effect of enhancing insulation reliability due to use of the surface-treated glass cloth of the present embodiment is especially great.

The printed wiring board of the present embodiment comprises the aforesaid surface-treated glass cloth of the present embodiment.

The printed wiring board of the present embodiment can be obtained, for example, by curing the aforesaid prepreg of the present embodiment.

The prepreg or a fiber-reinforced resin molded article comprising the surface-treated glass cloth of the present embodiment can be used for applications such as housings of antennas, radars and electronic devices, in addition to the printed wiring board.

Next, examples of the present invention and comparative examples will be described.

EXAMPLES

Example 1

In the present example, first, a glass cloth of cloth style #1078 (yarn used: D450 (filament diameter 5.0 μm, yarn weight: 11.0 tex), warp yarn weaving density: 53 yarns/25 mm, weft yarn weaving density: 53 yarns/25 mm) of IPC-4412 standard was passed through a silica microparticle adhesion tank containing a dispersion in which silica microparticles having a volume-average particle diameter of about 100 nm had been dispersed in water, thereby obtaining a glass cloth to which silica microparticles had adhered.

A glass constituting the glass cloth had a composition containing 54.5 mass % of $SiO_2$, 19.4 mass % of $B_2O_3$, 14.6 mass % of $Al_2O_3$, 4.2 mass % of MgO, 4.1 mass % of CaO, 0 mass % of SrO, 1.9 mass % of $TiO_2$, 0.1 mass % of $Fe_2O_3$, 0.2 mass % in total of $LiO_2$, $Na_2O$ and $K_2O$, and 1.0 mass % of $F_2$, based on the total amount of the glass (hereinafter referred to as glass composition A), and the glass composition A was a composition corresponding to the aforesaid first aspect.

Next, to the glass cloth to which silica microparticles had adhered was jetted a high-pressure water flow having a pressure of 2 MP and a temperature of 40° C. to perform opening treatment by water flow pressure, and then the glass cloth was heated at 360° C. for 60 hours to perform desizing.

Next, 3-methacryloxypropyltrimethoxysilane (manufactured by Dow Corning Toray Co., Ltd.) as a silane coupling agent having a methacrylic group and acetic acid were mixed with water in such a manner that the amount of the 3-methacryloxypropyltrimethoxysilane became 1.0 mass % in terms of a solid content and the amount of the acetic acid became 0.1 mass %, based on the total amount, and the mixture was stirred for 1 hour by a magnetic stirrer, thereby preparing a surface treatment agent aqueous solution. The surface treatment agent aqueous solution contains no surfactant at all.

Next, the glass cloth having been subjected to the desizing was immersed in the surface treatment agent aqueous solution, squeezed to remove extra moisture, and then dried by heating at 110° C. for 5 minutes, thereby obtaining a surface-treated glass cloth of the present embodiment. The resulting glass cloth was cut into a size of 350 mm×400 mm to prepare a surface-treated glass cloth piece. In this case, the amount of the silane coupling agent having adhered to the glass cloth was 0.53 part by mass based on 100 parts by mass of the surface-treated glass cloth. In the surface-treated glass cloth of Example 1, the surface treatment layer was composed of only the silane coupling agent having a methacrylic group.

Next, the surface-treated glass cloth piece was immersed in a polyphenylene ether resin varnish and dried at 150° C. for 10 minutes, thereby obtaining a surfactant-free prepreg. The polyphenylene ether resin varnish consisted of 450 parts by mass of OPE-2St/toluene (trade name, manufactured by MITSUBISHI GAS CHEMICAL COMPANY, INC.), 100 parts by mass of TAICROS triallyl isocyanurate (trade name, manufactured by Evonik Japan Co., Ltd.), 4 parts by mass of PERBUTYL P (trade name, manufactured by NOF Corporation), and 250 parts by mass of toluene (manufactured by Wako Co., Ltd.).

Next, four of the surfactant-fie prepregs were laminated, then cellophane films were laid above and below them, and they were heated and pressed by a vacuum hot press (manufactured by KITAGAWA SEIKI Co., Ltd.) at 205° C. and 1.8 MPa for 1 hour in vacuo, thereby obtaining a surfactant-free laminated plate having a plate thickness of about 0.3 mm.

Next, a surfactant-containing laminated plate having a plate thickness of about 0.3 mm was obtained in exactly the same manner as in the case of the surfactant-free laminated plate, except that instead of the surface treatment agent aqueous solution, a surface treatment agent aqueous solution prepared by mixing 3-methacryloxypropyltrimethoxysilane (manufactured by Dow Corning Toray Co., Ltd.), acetic acid and polyoxyethylene alkyl ether (manufactured by TOHO Chemical Industry Co., Ltd.) as a surfactant with water in such a manner that the amount of the 3-methacryloxypropyltrimethoxysilane became 1.0 mass % in terms of a solid content, the amount of the acetic acid became 0.1 mass %, and the amount of the polyoxyethylene alkyl ether became 0.05 mass %, and stirring them for 1 hour by a magnetic stirrer was used.

Next, the surfactant-free laminated plate and the surfactant-containing laminated plate were each cut out into a size of 7 cm×4 cm, and using a diamond cutter, two slits each having a length of 2 cm were made in both the longitudinal and the lateral directions on each laminated plate, thereby obtaining specimens shown in FIG. 1. In the specimen shown in FIG. 1, A=4 cm, B=7 cm, length of slit L=2 cm, and width of slit D=2 mm.

Next, a NaOH (manufactured by Wako Co., Ltd.) aqueous solution of 1 mol/L was introduced in a beaker and heated to 60° C., then each of the above specimens was immersed in the NaOH aqueous solution for 30 hours, and thereafter, an alkaline whitening test to measure a whitening distance due to peeling between the resin and the glass interface in the warp direction and the weft direction using a digital microscope (manufactured by Keyence Corporation) at 100-fold magnification was carried out. In the alkaline whitening test, whitening distances at 24 points in each of the warp direction and the weft direction were measured, and an average value of them was regarded as a whitening distance. The whitening distance due to interfacial peeling between the resin and the glass is correlated with the insulation reliability of a printed wiring board, and as the whitening distance is decreased, the insulation reliability becomes more excellent. The results are set forth in Table 1.

Example 21

In the present example, a surface-treated glass cloth was obtained in exactly the same manner as in Example 1, except that silica microparticles were not allowed to adhere to the glass cloth. Next, a whitening distance was measured by carrying out an alkaline whitening test in exactly the same manner as in Example 1, except that the surface-treated glass cloth obtained in the present example was used.

Regarding the surface-treated glass cloth obtained in the present example, a tensile strength in the weft direction was measured under the conditions of the number of samples N=5 in accordance with JIS R 3420. The results are set forth in Table 1.

Example 31

In the present example, a surface-treated glass cloth was obtained in exactly the same manner as in Example 2, except that a high-pressure water flow having a pressure of 0.1 MP and a temperature of 40° C. was jetted to perform opening treatment by water flow pressure. Next, a whitening distance was measured by carrying out an alkaline whitening test in exactly the same manner as in Example 1, except that the surface-treated glass cloth obtained in the present example was used. The results are set forth in Table 1.

Example 41

In the present example, a surface-treated glass cloth was obtained in exactly the same manner as in Example 2, except that a glass cloth of cloth style #2116 (yarn used: E225 (filament diameter 7.0 μm, yarn weight: 22.0 tex), warp yarn weaving density: 59.1 yarns/25 mm, weft yarn weaving density: 57.1 yarns/25 mm) of IPC-4412 standard was used. The amount of the silane coupling agent having adhered to the glass cloth was 0.36 part by mass based on 100 parts by mass of the surface-treated glass cloth. In the surface-treated glass cloth of the present example, the surface treatment layer was composed of only the silane coupling agent having a methacrylic group.

Next, a whitening distance was measured by carrying out an alkaline whitening test in exactly the same manner as in Example 1, except that the surface-treated glass cloth obtained in the present example was used. The results are set forth in Table 1.

Example 51

In the present example, a surface-treated glass cloth was obtained in exactly the same manner as in Example 2, except that a glass cloth of cloth style #1035 (yarn used: D900 (filament diameter 5.0 μm, yarn weight: 5.5 tex), warp yarn weaving density: 65 yarns/25 mm, weft yarn weaving density: 67 yarns/25 mm) of IPC-4412 standard was used. The amount of the silane coupling agent having adhered to the glass cloth was 0.47 part by mass based on 100 parts by mass of the surface-treated glass cloth. In the surface-treated glass cloth of the present example, the surface treatment layer was composed of only the silane coupling agent having a methacrylic group.

Next, a whitening distance was measured by carrying out an alkaline whitening test in exactly the same manner as in Example 1, except that the surface-treated glass cloth obtained in the present example was used. The results are set forth in Table 1.

Example 6

In the present example, a surface-treated glass cloth was obtained in exactly the same manner as in Example 2, except that the glass constituting the glass cloth was changed to one having a composition containing 55.0 mass % of $SiO_2$, 24.0 mass % of $B_2O_3$, 12.0 mass % of $Al_2O_3$, 2.0 mass % of MgO, 2.0 mass % of CaO, 4.0 mass % of SrO, 0.0 mass % of $TiO_2$, 0.0 mass % of $Fe_2O_3$, 0.0 mass % in total of $LiO_2$, $Na_2O$ and $K_2O$, and 1.0 mass % of $F_2$, based on the total amount of the glass (hereinafter referred to as glass composition B). The glass composition B was a composition corresponding to the aforesaid second aspect. The amount of the silane coupling agent having adhered to the glass cloth was 0.70 part by mass based on 100 parts by mass of the surface-treated glass cloth. In the surface-treated glass cloth of the present example, the surface treatment layer was composed of only the silane coupling agent having a methacrylic group.

Next, a whitening distance was measured by carrying out an alkaline whitening test in exactly the same manner as in Example 1, except that the surface-treated glass cloth obtained in the present example was used.

Further, a tensile strength was measured in exactly the same manner as in Example 2, except that the surface-treated glass cloth obtained in the present example was used. The results are set forth in Table 1.

Comparative Example 1

In the present comparative example, a surface-treated glass cloth was obtained in exactly the same manner as in Example 2, except that a surface treatment agent aqueous solution containing N-β-(N-vinylbenzylamino)ethyl-aminopropylmethoxysilane as a silane coupling agent was used. The amount of the silane coupling agent having adhered to the glass cloth was 0.44 part by mass based on 100 parts by mass of the glass fiber yarns.

Next, a whitening distance was measured by carrying out an alkaline whitening test in exactly the same manner as in Example 1, except that the surface-treated glass cloth obtained in the present example was used. The results are set forth in Table 2.

Comparative Example 2

In the present comparative example, a surface-treated glass cloth was obtained in exactly the same manner as in Example 2, except that a surface treatment agent aqueous solution containing 3-aminopropyltrimethoxysilane as a silane coupling agent was used. The amount of the silane coupling agent having adhered to the glass cloth was 0.35 part by mass based on 100 parts by mass of the glass fiber yarns.

Next, a whitening distance was measured by carrying out an alkaline whitening test in exactly the same manner as in Example 1, except that the surface-treated glass cloth obtained in the present example was used. The results are set forth in Table 2.

Comparative Example 3

In the present comparative example, a surface-treated glass cloth was obtained in exactly the same manner as in Example 2, except that the glass constituting the glass cloth was changed to one having a composition containing 54.6 mass % of $SiO_2$, 6.1 mass % of $B_2O_3$, 14.1 mass % of $Al_2O_3$, 1.2 mass % of MgO, 22.4 mass % of CaO, 0 mass % of SrO, 0.3 mass % of $TiO_2$, 0.2 mass % of $Fe_2O_3$, 0.5 mass % in total of $LiO_2$, $Na_2O$ and $K_2O$, and 0.6 mass % of $F_2$, based on the total amount of the glass (hereinafter referred to as glass composition C). The amount of the silane coupling agent having adhered to the glass cloth was 0.21 part by mass based on 100 parts by mass of the glass fiber yarns.

Next, a whitening distance was measured by carrying out an alkaline whitening test in exactly the same manner as in Example 1, except that the surface-treated glass cloth obtained in the present example was used. The results are set forth in Table 2.

Comparative Example 4

In the present comparative example, a surface-treated glass cloth was obtained in exactly the same manner as in Comparative Example 3, except that a surface treatment agent aqueous solution containing N-β-(N-vinylbenzylamino)ethyl-aminopropylmethoxysilane as a silane coupling agent was used. The amount of the silane coupling agent having adhered to the glass cloth was 0.21 part by mass based on 100 parts by mass of the glass fiber yarns.

Next, a whitening distance was measured by carrying out an alkaline whitening test in exactly the same manner as in Example 1, except that the surface-treated glass cloth obtained in the present example was used. The results are set forth in Table 2.

agent having a methacrylic group and contained no surfactant, and therefore, the whitening distance was small even when compared with that of the surface-treated glass cloths of Examples 2 to 5 in which silica microparticles had not adhered to glass filament surfaces, so that the insulation reliability can be further enhanced.

Furthermore, it is obvious that according to the surface-treated glass cloth of Example 2 in which the composition of the glass constituting the glass cloth was the glass compo-

TABLE 1

|  | Example 1 | Example 2 | Example 3 | Example 4 | Example 5 | Example 6 |
| --- | --- | --- | --- | --- | --- | --- |
| Glass cloth style | #1078 | #1078 | #1078 | #2116 | #1035 | #1078 |
| Glass composition | A | A | A | A | A | B |
| Silane coupling agent | methacrylic | methacrylic | methacrylic | methacrylic | methacrylic | methacrylic |
| Silica microparticle | present | absent | absent | absent | absent | absent |
| Thickness of glass cloth (μm) | 44 | 44 | 44 | 89 | 31 | 47 |
| Surface coverage (%) | 98.5 | 98.5 | 80.3 | 99.0 | 97.3 | 99.5 |
| Whitening distance in surfactant-free case | 19 | 46 | 156 | 65 | 86 | 48 |
| Whitening distance in surfactant-containing case | 92 | 118 | 191 | 142 | 275 | 198 |
| (Whitening distance in surfactant-free case)/(whitening distance in surfactant-containing case) | 0.21 | 0.39 | 0.82 | 0.46 | 0.31 | 0.24 |
| Tensile strength (N/25 mm) | — | 155 | — | — | — | 141 |

Silane coupling agent
methacrylic: 3-methacryloxypropyltrimethoxysilane

TABLE 2

|  | Comparative Example 1 | Comparative Example 2 | Comparative Example 3 | Comparative Example 4 |
| --- | --- | --- | --- | --- |
| Glass cloth style | #1078 | #1078 | #1078 | #1078 |
| Glass composition | A | A | C | C |
| Silane coupling agent | cationic | amino | methacrylic | cationic |
| Silica microparticle | absent | absent | absent | absent |
| Thickness of glass cloth (μm) | 44 | 44 | 44 | 44 |
| Surface coverage (%) | 98.8 | 99.5 | 98.5 | 99.0 |
| Whitening distance in surfactant-free case | 1332 | 336 | 40 | 373 |
| Whitening distance in surfactant-containing case | 450 | 337 | 19 | 358 |
| (Whitening distance in surfactant-free case)/(whitening distance in surfactant-containing case) | 2.96 | 1.00 | 2.11 | 1.04 |
| Tensile strength (N/25 mm) | — | — | — | — |

Silane coupling agent
methacrylic: 3-methacryloxypropyltrimethoxysilane
cationic: N-β-(N-vinylbenzylamino)ethyl-aminopropylmethoxysilane
amino: 3-aminopropyltrimethoxysilane From Table 1, it is obvious that in the surface-treated glass cloths of Examples 1 to 6 each of which was obtained by surface-treating a glass cloth having been obtained by weaving glass fibers having a composition containing 15 mass % or more of $B_2O_3$, the surface treatment layer contained a silane coupling agent having a methacrylic group and contained no surfactant, and therefore, the whitening distance and the ratio of the whitening distance in the surfactant-free case to the whitening distance in the surfactant-containing case were small, so that the insulation reliability can be enhanced.

Further, it is obvious that according to the surface-treated glass cloth of Example 1 in which silica microparticles had adhered to surfaces of glass filaments constituting the glass cloth, the surface treatment layer contained a silane coupling sition A corresponding to the first aspect, the tensile strength became high as compared with that of the surface-treated glass cloth of Example 6 in which the composition of the glass constituting the glass cloth was the glass composition B corresponding to the second aspect.

On the other hand, it is obvious that in the surface-treated glass cloths of Comparative Examples 1 and 2 each of which was obtained by surface-treating a glass cloth having been obtained by weaving glass fibers having a composition containing 15 mass % or more of $B_2O_3$ and in each of which the surface treatment layer contained a silane coupling agent other than the silane coupling agent having a methacrylic group, the whitening distance in the case where the surface treatment layer contained no surfactant was larger than or equal to that in the case where the surface treatment layer contained a surfactant, so that the effect of enhancing insulation reliability due to a surface treatment layer containing no surfactant cannot be obtained.

Further, it is obvious that in the surface-treated glass cloth of Comparative Example 3 obtained by surface-treating a glass cloth having been obtained by weaving glass fibers having a composition containing less than 15 mass % of $B_2O_3$, the whitening distance in the case where the surface treatment layer contained no surfactant is larger than that in the case where the surface treatment layer contained a surfactant even when the surface treatment layer contained a silane coupling agent having a methacrylic group, so that the effect of enhancing insulation reliability due to a surface treatment layer containing no surfactant cannot be obtained.

Furthermore, it is obvious that in the surface-treated glass cloth of Comparative Example 3 which was obtained by surface-treating a glass cloth having been obtained by weaving glass fibers having a composition containing less than 15 mass % of $B_2O_3$ and in which the surface treatment layer contained a silane coupling agent other than the silane coupling agent having a methacrylic group, the whitening distance in the case where the surface treatment layer contained no surfactant is equal to that in the case where the surface treatment layer contained a surfactant, so that the effect of enhancing insulation reliability due to a surface treatment layer containing no surfactant cannot be obtained.

REFERENCE SIGNS LIST

No reference signs

The invention claimed is:

1. A surface-treated glass cloth comprising a surface treatment layer on a surface, wherein:
   a glass constituting the glass cloth has a composition containing 52.0 to 60.0 mass % of $SiO_2$, 15.0 to 26.0 mass % of $B_2O_3$, 9.0 to 18.0 mass % of $Al_2O_3$, 1.0 to 8.0 mass % of MgO, 1.0 to 10.0 mass % of CaO, 0 to 6.0 mass % of SrO, 0 to 6.0 mass % of $TiO_2$, and 0.1 to 3.0 mass % in total of $F_2$ and $Cl_2$, based on a total amount of the glass;
   the glass cloth has a surface coverage in a range of 75.0 to 100.0% and a thickness in a range of 8 to 95 µm; and
   the surface treatment layer contains a silane coupling agent having a methacrylic group and contains no surfactant.

2. The surface-treated glass cloth according to claim 1, wherein a silica fine particle adheres to a surface of a glass filament constituting the glass cloth.

3. The surface-treated glass cloth according to claim 1, wherein the glass cloth has a surface coverage in a range of 85.5 to 100.0%.

4. The surface-treated glass cloth according to claim 3, wherein the glass cloth has a thickness in a range of 8 to 60 µm.

5. The surface-treated glass cloth according to claim 3, wherein the glass cloth has a thickness in a range of 8 to 40 µm.

6. The surface-treated glass cloth according to claim 1, wherein the glass constituting the glass cloth has a composition containing 52.0 to 60.0 mass % of $SiO_2$, 15.0 mass % or more and less than 20.0 mass % of $B_2O_3$, 9.0 to 18.0 mass % of $Al_2O_3$, 10.0 to 6.0 mass % of MgO, 1.0 to 9.0 mass % of CaO, 0 mass % or more and less than 0.5 mass % of SrO, 1.0 to 6.0 mass % of $TiO_2$, and 0.1 to 2.5 mass % in total of $F_2$ and $Cl_2$, based on the total amount of the glass.

7. The surface-treated glass cloth according to claim 1, wherein the glass constituting the glass cloth has a composition containing 52.0 to 60.0 mass % of $SiO_2$, 20.0 mass % or more and less than 26.0 mass % of $B_2O_3$, 9.0 to 18.0 mass % of $Al_2O_3$, 10.0 to 6.0 mass % of MgO, 1.0 to 9.0 mass % of CaO, 0.5 mass % or more and less than 6.0 mass % of SrO, 0 to 6.0 mass % of $TiO_2$, and 0.1 to 2.5 mass % in total of $F_2$ and $Cl_2$, based on the total amount of the glass.

8. A prepreg comprising the surface-treated glass cloth according to claim 1.

9. A printed wiring board comprising the surface-treated glass cloth according to claim 1.

* * * * *